United States Patent [19]

Stanley

[11] 4,241,418
[45] Dec. 23, 1980

[54] CLOCK SYSTEM HAVING A DYNAMICALLY SELECTABLE CLOCK PERIOD

[75] Inventor: Philip E. Stanley, Westboro, Mass.

[73] Assignee: Honeywell Information Systems Inc., Waltham, Mass.

[21] Appl. No.: 854,301

[22] Filed: Nov. 23, 1977

[51] Int. Cl.³ .................... H03K 5/04; H03K 5/159
[52] U.S. Cl. .................................. 364/900; 307/208; 307/265; 307/293; 328/61; 328/63; 328/72; 328/74
[58] Field of Search ... 364/900 MS File, 200 MS File; 307/208, 265, 293; 328/60, 61, 63, 72, 74

[56] References Cited

U.S. PATENT DOCUMENTS

| | | | |
|---|---|---|---|
| 3,343,136 | 9/1967 | Nyberg | 364/200 |
| 3,418,498 | 12/1968 | Farley | 307/208 |
| 3,543,295 | 11/1970 | Overstreet, Jr. | 307/208 |
| 3,593,158 | 7/1971 | Day et al. | 307/208 |
| 3,594,733 | 7/1971 | Lukens | 364/900 |
| 3,624,519 | 11/1971 | Beydler | 307/208 |
| 3,775,696 | 11/1973 | Garth | 307/208 |
| 3,868,647 | 2/1975 | Zandveld | 364/200 |
| 3,993,957 | 11/1976 | Davenport | 307/208 |
| 4,040,021 | 8/1977 | Birchall et al. | 364/200 |
| 4,050,096 | 9/1977 | Bennett et al. | 364/200 |
| 4,105,978 | 8/1978 | Goss et al. | 328/61 |
| 4,134,073 | 1/1979 | MacGregor | |

*Primary Examiner*—Gareth D. Shaw
*Assistant Examiner*—E. Chan
*Attorney, Agent, or Firm*—William A. Linnell; Nicholas Prasinos; Ronald T. Reiling

[57] ABSTRACT

A clock system for providing rectangular wave forms or wave trains, with each wave train having a selectable predetermined clock cycle period. A rectangular wave train is generated by a generator comprising a delay line coupled to an INVERTER. By using a second delay line to delay the rectangular wave by a selectable predetermined delay period, a control signal is formed which when fed into the generator produces a second rectangular wave train with a clock cycle period equal to that of the rectangular wave clock cycle period plus the period of the second predetermined delay. The addition of a synchronization circuit permits the clock cycle period to be dynamically selected during a clock cycle. This provides a rectangular train with the period of each clock cycle being any of the predetermined clock cycle periods independent of the clock cycle period of preceding or succeeding clock cycles.

17 Claims, 18 Drawing Figures

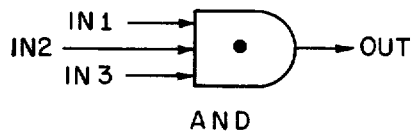
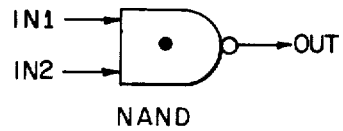
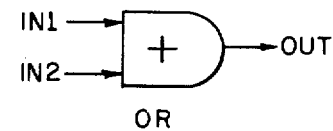
FIG. 5-1
FIG. 5-2
FIG. 5-3
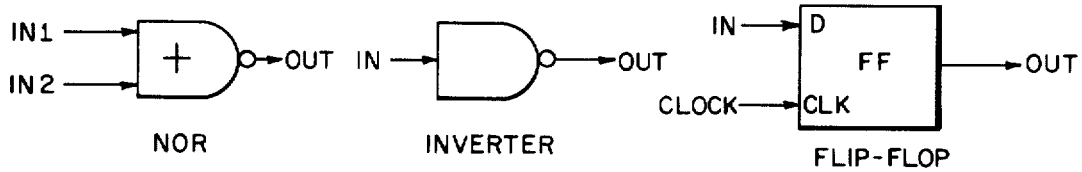
FIG. 5-4
FIG. 5-5
FIG. 5-6

BASIC CLOCK CYCLE

MEDIUM-SHORT CLOCK CYCLE
(T3<T2, DESIRED CLOCK)

MEDIUM-SHORT CLOCK CYCLE
(T3 > T2, UNDESIRED CLOCK)

MEDIUM-LONG CLOCK CYCLE

LONG CLOCK CYCLE

STALL LOW DURING MEDIUM-SHORT CLOCK CYCLE

STALL LOW DURING MEDIUM-SHORT CLOCK CYCLE

HIGH PORTION SHORTENED BY STALL LOW

| CLOCK CYCLE NAME | CYCLE SELECT BITS | | LOW (FIRST) PORTION TIME | HIGH (SECOND) PORTION TIME | CLOCK CYCLE TIME (TOTAL) |
|---|---|---|---|---|---|
| | CS1 | CS2 | | | |
| BASIC | 1 | 1 | T2 | T2 | 2 X T2 |
| MEDIUM SHORT | 0 | 1 | T2+T3 | T2 | 2 X T2+T3 |
| MEDIUM LONG | 1 | 0 | T2+T4 | T2 | 2 X T2+T4 |
| LONG | 0 | 0 | T2+T7 | T2 | 2 X T2+T7 |

FIG. 8

CLOCK SYSTEM HAVING A DYNAMICALLY SELECTABLE CLOCK PERIOD

BACKGROUND OF THE INVENTION

The present invention generally relates to data processing systems and more particularly to clock systems utilized in controlling the transfer of information in such data processing systems.

In data processing systems, the transfer of information is typically controlled by clock pulses derived from clock cycles generated by a clock system. In a typical clock system, the clock generates a rectangular wave train signal, with the signal being a high state for a portion of the clock cycle and the signal being in a low state for the remainder of the clock cycle. In this type of clock system, the clock pulses are generated by detecting the change of signal from the high to low state and/or from the low to high state.

The period of the clock cycle of a data processing system is usually chosen to match the speed of the central processor to the speed of the memory. It is not unusual for vendors of data processing systems to offer a selection of memories having different speeds to be used in conjunction with a given central processor model. In these cases, the availability of a clock system with a selectable clock cycle period will allow easy matching of the central processor speed to that of the memory chosen.

In microprogrammed data processing systems, the execution time of the various microoperations will usually vary in accordance with the complexity of the microoperation performed. The more complex operations usually requiring more time to allow the signals more time to propagate through the increased number of logic gates involved. To maximize performance of a microprogrammed data processing system, it is desirable to have a clock cycle period available that matches the time required by each distinct microoperation. Although this matching could be accomplished by having multiple clock systems, it is much more desirable of circuit component expense and synchronization problems, to have one system from which a variety of predetermined clock cycle periods can be dynamically selected. The selection process should be such that after the microinstruction is read from the microprogram control store, and the particular microoperation to be performed by the microinstruction is determined, the clock cycle period can be adjusted to permit sufficient time, but not excessive time, to complete the particular mircooperation in the process of being executed. The clock cycle period can be implicitly selected by being associated with the microoperation of the microinstruction with the microoperation decoder providing one or more bits used to select the clock cycle period. In a data processing system that does not overlap the execution of microinstructions, e.g., the next microinstruction being read during the execution of the current microinstruction, it is important that the clock system be such that the clock cycle period selection and generation be done within the selected clock cycle period.

In any clock system, particularly when used in a data processing system, the stability of the clock cycle period is important. That is, it is desirable that the clock cycle period vary as little as possible due to variation in component operating temperature, operating voltage, or the particular component used in fabrication of a particular clock system. Each component used in fabricating a clock system has its own propagation time tolerances. Because the summation of the individual propagation time tolerances of each component used in a path of a clock system circuit is used to determine the worst case timing of a clock system, it follows that reducing the number of components in each path will lead to increased clock stability. Stability can also be increased by choosing components which inherently have narrower tolerances than other components. For example, it may be desirable in a clock system circuit to use a delay line which has a typical propagation time tolerance of plus or minus 5% due to voltage and temperature variations rather than multivibrators or one shots which have looser typical propagation time tolerances. By minimizing the number of components and by using components with inherently narrower tolerances, manufacturing economy can be achieved and the need to individually tune each clock system during manufacture can be eliminated.

A clock system in a data processing system is generally inhibited from generating clock pulse when information is not to be strobed into a receiving element, so as to prevent the transfer of erroneous information or loss of information thereby creating an error condition. Accordingly, a stall signal or condition is generated. A typical example of a stall condition may be, for example, that condition under which a utilizing element, such as a central processor, is waiting for the data processing system's memory to provide information thereto. When the receiving element is expecting the information from the memory, a clock pulse is not generated for strobing the information to the receiving element, particularly if there is an indication that the memory will not be providing such information for possibly another clock cycle. Accordingly, a stall condition is generated that will stall the clock by preventing the clock rectangular wave train signal from changing state, thereby stalling the generation of further clock pulses. By providing a stall high signal that stalls the clock rectangular wave train signal in the high state, the high to low clock pulse can be inhibited. By providing a stall low signal that stalls the clock rectangular wave train signal in the low state, the low to high clock pulse can be inhibited. These stall conditions however, upon an indication that the information will be presently transferred, will be cleared so as to generate another clock cycle and the pulses derived therefrom. It is important in such clock systems that the clock be able to start up again in a minimum period of time after the removal of the stall condition. An example of a stallable clock system is given in U.S. Pat. No. 4,134,073 "Clock System Having Adaptive Synchronization Feature" issued to William W. MacGregor and assigned to the assignee of the present invention.

OBJECTS OF THE INVENTION

It is a primary object of the invention therefore to provide an improved means for providing a plurality of selectable clock cycle periods.

It is another primary object of the invention to be able to dynamically select the period of the clock cycle, after the clock cycle has started.

It is still a further object of the invention to provide a stable clock cycle whose period does not vary unduly with component operating temperature, operating voltage, or choice of the particular components used in the manufacture of the clock system.

It is yet another object of the invention to provide a clock system with the minimum number of components in the circuit path used to generate the shortest clock cycle period.

It is another object of the invention to provide a clock system which is adaptive in design to provide synchronization or start up of a clock cycle in a minimum period of time after the removal of a stall high signal or stall low signal.

SUMMARY OF THE INVENTION

In accordance with the above and other objectives of the invention, a delay element such as a delay line which has one or more associated delay periods is utilized to generate a control signal having a first state and a second state which is fed back to a controllable rectangular wave train generator. The delay element is utilized to receive and delay a rectangular wave train produced by the rectangular wave train generator. The rectangular wave train is comprised of a series of clock cycles composed of a first portion having a first state and a second portion having a second state. A logic circuit is provided which receives the one or more delayed rectangular wave train signals from the delay line and forms the control signal.

The rectangular wave train generator responds to the first state of the control signal by inhibiting generation of the second portion of a clock cycle thereby extending the duration of the preceding first portion of the clock cycle. The rectangular wave train generator responds to the second state of the control signal by enabling generation of the second portion of a clock cycle which has a normal duration.

The logic circuit is further responsive to cycle select signals which determine which of the one or more delayed rectangular wave train signals will be used to form the control signal, thus permitting the selection of the clock cycle period from a set of predetermined clock cycle periods. The addition of a synchronizer circuit allows the cycle select signals to be changed during the generation of a clock cycle thereby permitting the generation of a rectangular wave train with each clock cycle period being dynamically selected after the generation of the clock cycle has started. This dynamic selection capability permits the clock system to generate a rectangular wave train with each clock cycle period being a predetermined period but independent of the period of the preceding or succeeding clock cycle.

The rectangular wave train generator includes gate logic which is responsive to a stall low signal having a first state and a second state. This gate logic responds to the first state of the stall low signal by inhibiting the rectangular wave train generator from producing the second state of a clock cycle and responsive to the second state of the stall low signal by enabling the rectangular wave train generator to resume generation of the clock cycle in an adaptive manner with only a minimal delay. The rectangular wave train generator includes further gate logic which is responsive to a stall high signal having a first state and a second state. This further gate logic responds to the first state of the stall high signal by inhibiting the rectangular wave train generator from producing the first state of a clock cycle and responsive to the second state of the stall high signal by enabling the rectangular wave train generator to resume generation of the clock cycle in an adaptive manner with only a minimal delay.

BRIEF DESCRIPTION OF THE DRAWINGS

FIG. 5-1 through 5-6 illustrate the logic symbols and associated truth tables for the well known AND, NAND, OR, and NOR logic gates and INVERTER and flip-flop logic respectively.

FIGS. 6-1 through 6-5 include wave trains illustrative of the operation of the apparatus of FIG. 4 during the generation of the basic, medium-short, medium-long, and long clock cycles respectively.

FIG. 7-1 includes wave trains illustrative of the operation of the apparatus of FIG. 4 during a medium-short clock cycle with a stall low condition occurring while the control signal is the low state and continuing until after the control signal is in the high state.

FIG. 7-2 includes wave trains illustrative of the operation of the apparatus of FIG. 4 during a medium-short clock cycle with a stall low condition occurring while the control signal is in the high state and continuing until after the control signal is in the low state.

FIG. 8 list the values of the cycle select signals used to select each of the four clock cycle periods.

DETAILED DESCRIPTION OF THE PREFERRED EMBODIMENT

Figure 1:
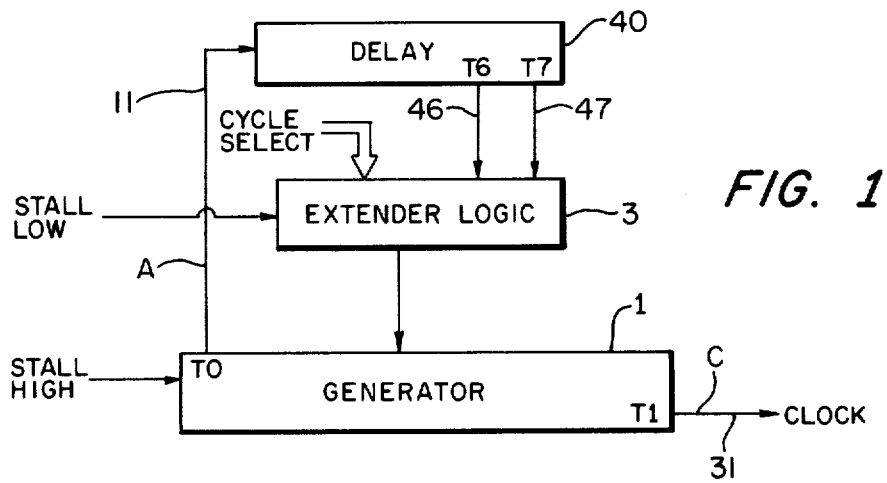
FIG. 1 is a block diagram of the apparatus of the present invention.

FIG. 1 illustrates the apparatus of the present invention. Such apparatus or clock system is utilized for generating a rectangular wave train from which clock cycles and clock pulses are derived.

Figure 2:
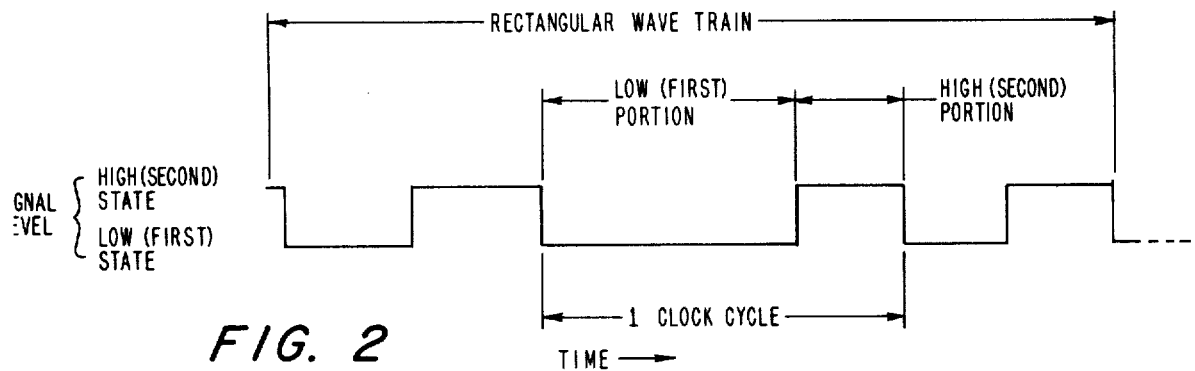
FIG. 2 is a diagram of a segment of a clock system generated rectangular wave train showing the low portion and the high portion of a clock cycle.

FIG. 2 illustrates a rectangular wave train and shows that one clock cycle is composed of a low or first portion having a low or first state and a high or second portion having a high or second state.

In the present invention, a clock cycle generator 1, hereafter referred to as generator 1, is used to generate a first rectangular wave train which is fed to and delayed by a delay element 40. In the preferred embodiment, delay element 40 may be a delay line. By using the well known technique of tapping a delay line at various distances from its input, one or more delayed rectangular wave trains are provided by delay element 40 which are fed to clock cycle extender logic 3, hereafter referred to as extender logic 3. Extender logic 3, in response to one or more cycle select signals uses the one or more delayed rectangular wave trains to form a control signal which is output by extender logic 3 to generator 1. The control signal has a low or first state and a high or second state.

The output of generator 1 is the clock rectangular wave train, hereafter sometimes referred to as the clock train. Generator 1 is responsive to the control signal provided by extender logic 3 such that when the control signal is in the low state, generator 1 inhibits the clock train from changing from the low to high state and when the control signal is in the high state, generator 1 enables the clock train to change from the low to the high state or from the high to the low state.

This inhibiting by the low state of the control signal results in the low portion of the clock cycle being extended by the difference in time between the time the clock train would, without the presence of the control signal, go to the high state and the time when the control signal goes to the high state. As will be seen below, this extensional time period is determined by selecting the appropriate dealy times provided by the various taps of delay element 40. As will also be seen below, the control signal, during each clock cycle, must be in the low state before the clock train would otherwise go to the high state.

Figure 3:
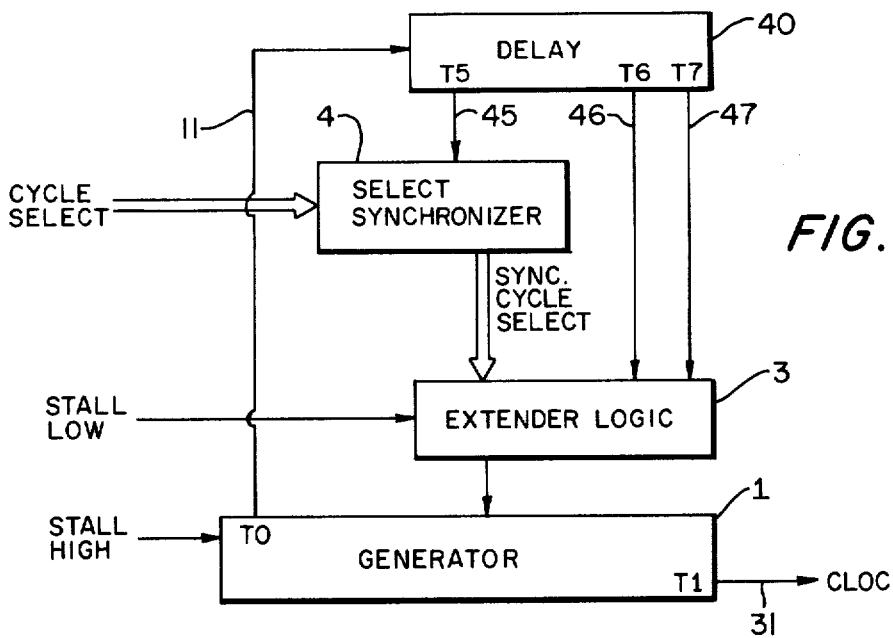
FIG. 3 is a block diagram of the apparatus of the present invention showing the addition of the select synchronizer element.

FIG. 3 further illustrates the apparatus of the present invention by including the addition of select synchronizer element 4. The addition of the select synchronizer element 4 allows the clock cycle period to be dynamically selected during a clock cycle. Select synchronizer element 4 uses a delayed rectangular wave train provided by delay element 40 on line 45 to synchronize the gating of cycle select signals to extender logic 3. As will be seen below, for the cycle period to be dynamically selected, the cycle select signals must become stable and be gated to extender logic 3, during each clock cycle, before the clock train would otherwise go to the high state.

In FIGS. 1, 3, 4, 6, 7 and 8, the symbols T1 through T8 designate the respective times that a signal starting on line 11 at a time T0 requires to reach lines 31, 32, 43, 44, 45, 46, 47 and 38 (FIG. 4) respectively. For example, a pulse occurring on line 11 at time T0 reaches line 46 at time T6 later. FIGS. 6-1 through 7-2 illustrate rectangular wave trains designated A through J. Trains A through J are the wave trains that occur on lines 11, 21, 31, 32, 43, 44, 45, 46, 47, and line 38 respectively of FIG. 4.

Figure 4:
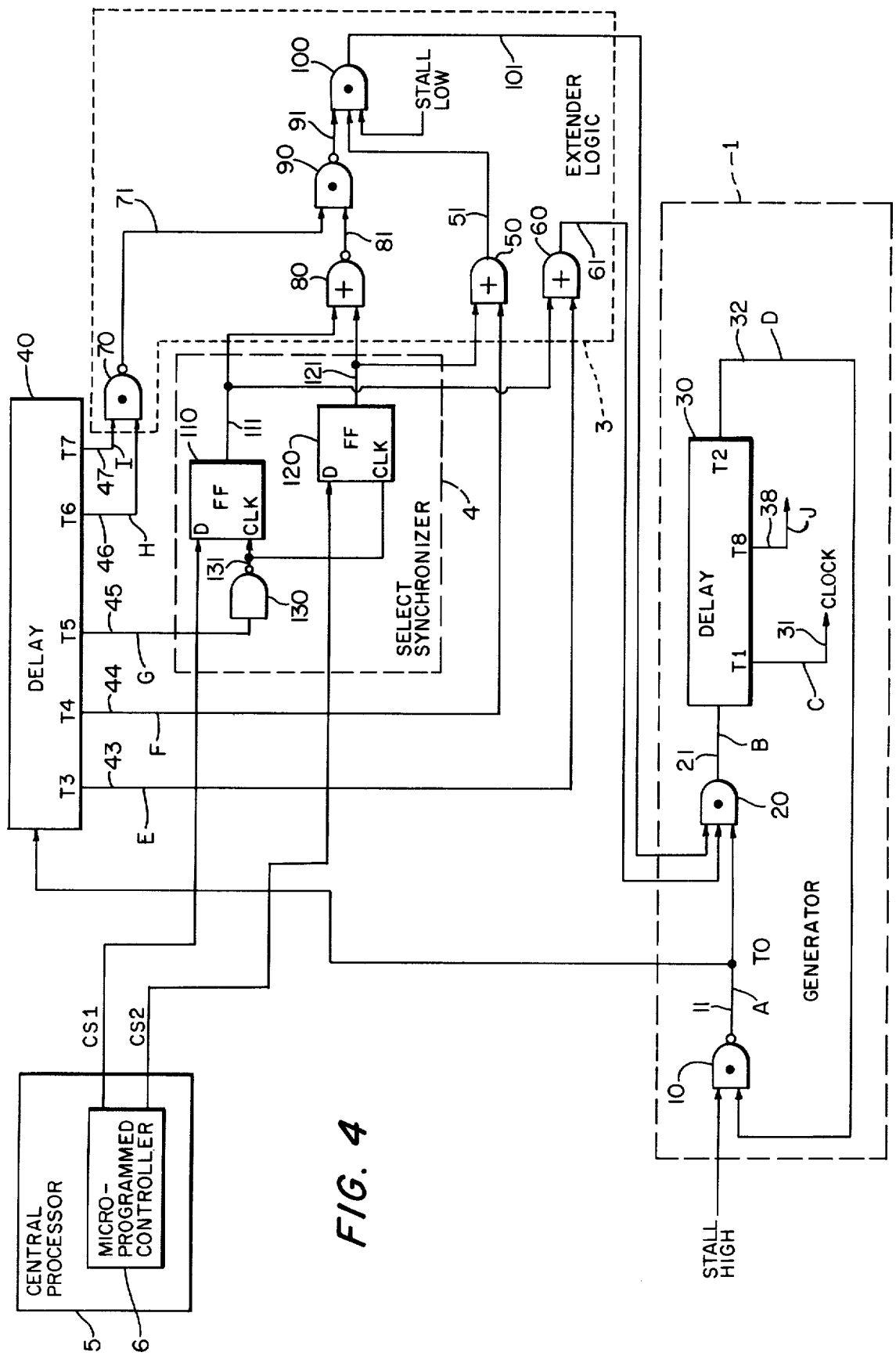
FIG. 4 is a logic diagram of a preferred embodiment of the present invention.

The following functional description is restricted to the activity of generator element 1. FIG. 4 is a schematic diagram of a preferred embodiment of the present invention. FIG. 4 shows that generator element 1 comprises NAND gate 10, AND gate 20 and delay element 30 with connecting lines 11, 21, 31 and 32. The clock signal appears on line 31. In this discussion, signals on lines 61 and 101, the top two inputs of AND gate 20, are normally inactive, i.e., high. The active use of signals on lines 61 and 101 is described in subsequent paragraphs. The rectangular wave train is generated basically by the use of delay element 30, which is typically in a preferred embodiment a delay line, and the inverting function of NAND gate 10. Since the two top inputs of AND gate 20 are normally high, the output of AND gate 20 is equal to and is controlled exclusively by the bottom input of AND gate 20 which is coupled to the output of NAND gate 10. As indicated by the truth table of FIG. 5-1, when the top two inputs of AND gate are high, i.e., a binary ONE, then the output of the AND gate is equal to and controlled by the bottom input of the AND gate. Therefore, in this case, with the top two inputs of AND gate 20 normally high, it follows that AND gate 20 plays no essential roll in the generation of the rectangular wave train presently being described.

Figures 1, 6:
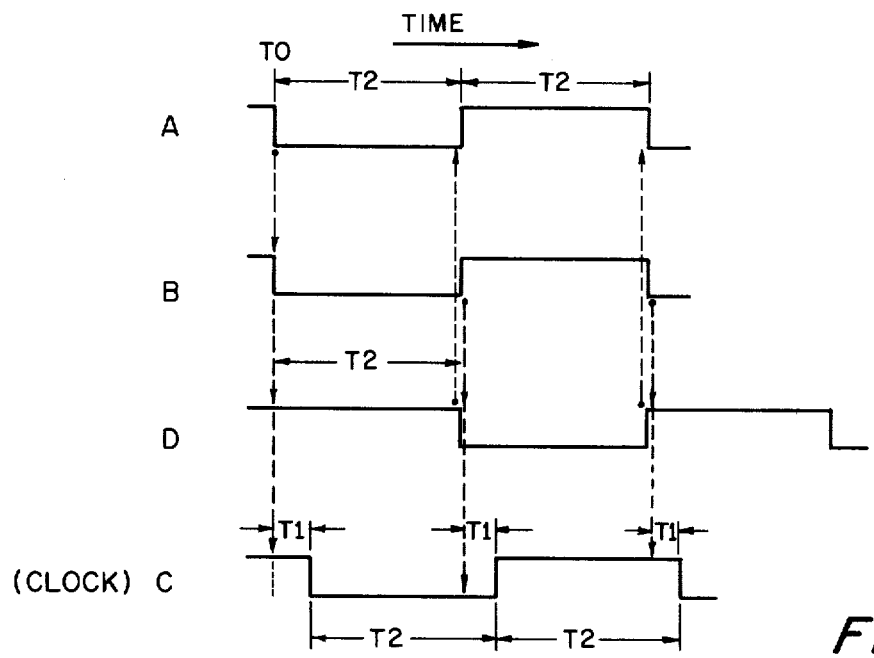
Figures 2, 6:
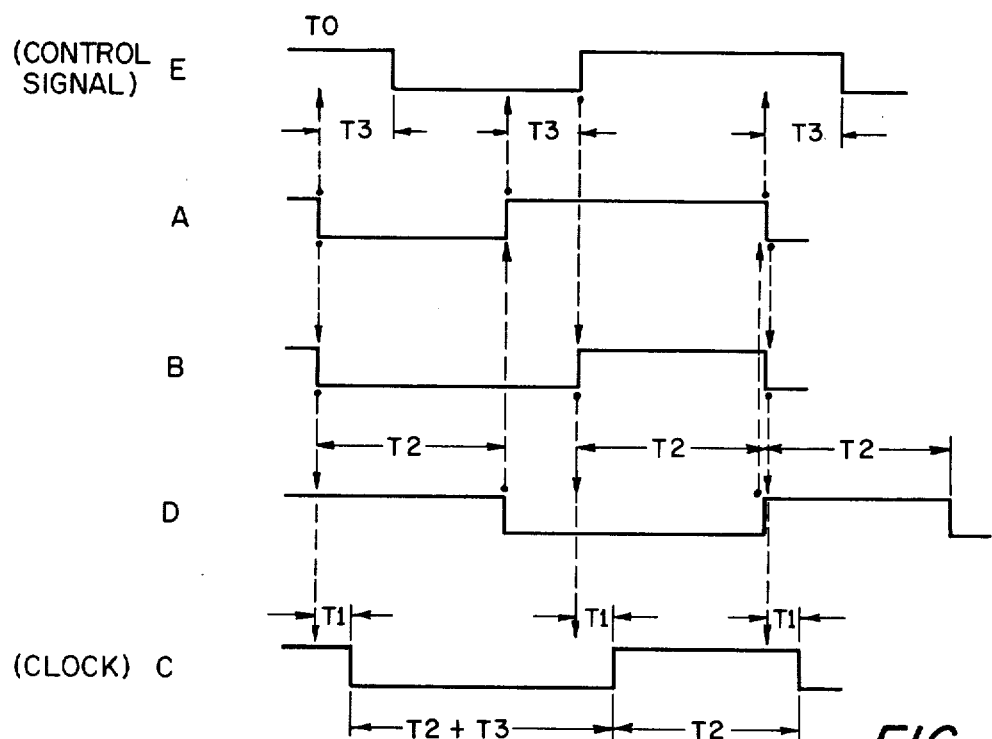
Figures 3, 6:
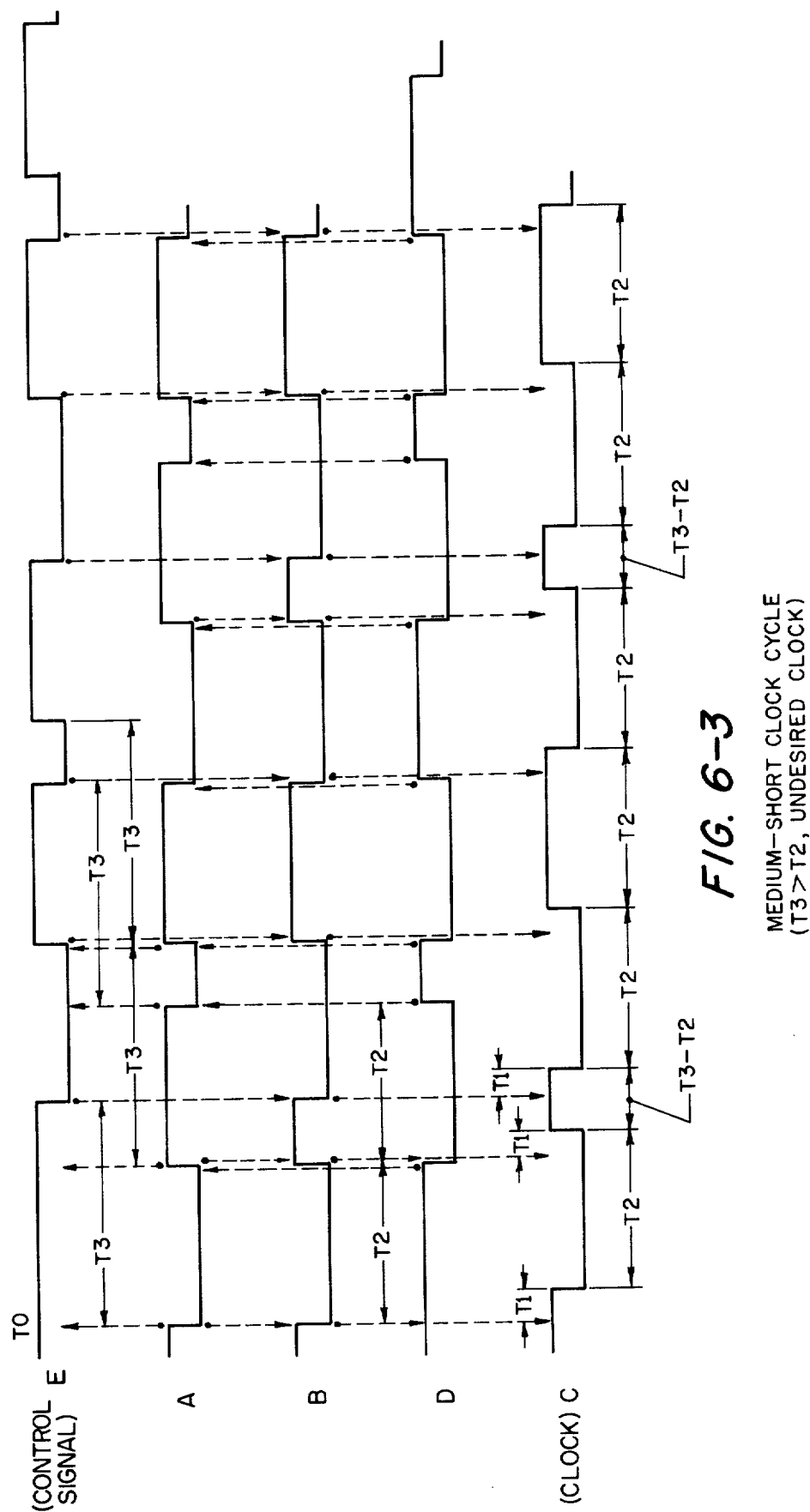
Figures 4, 6:
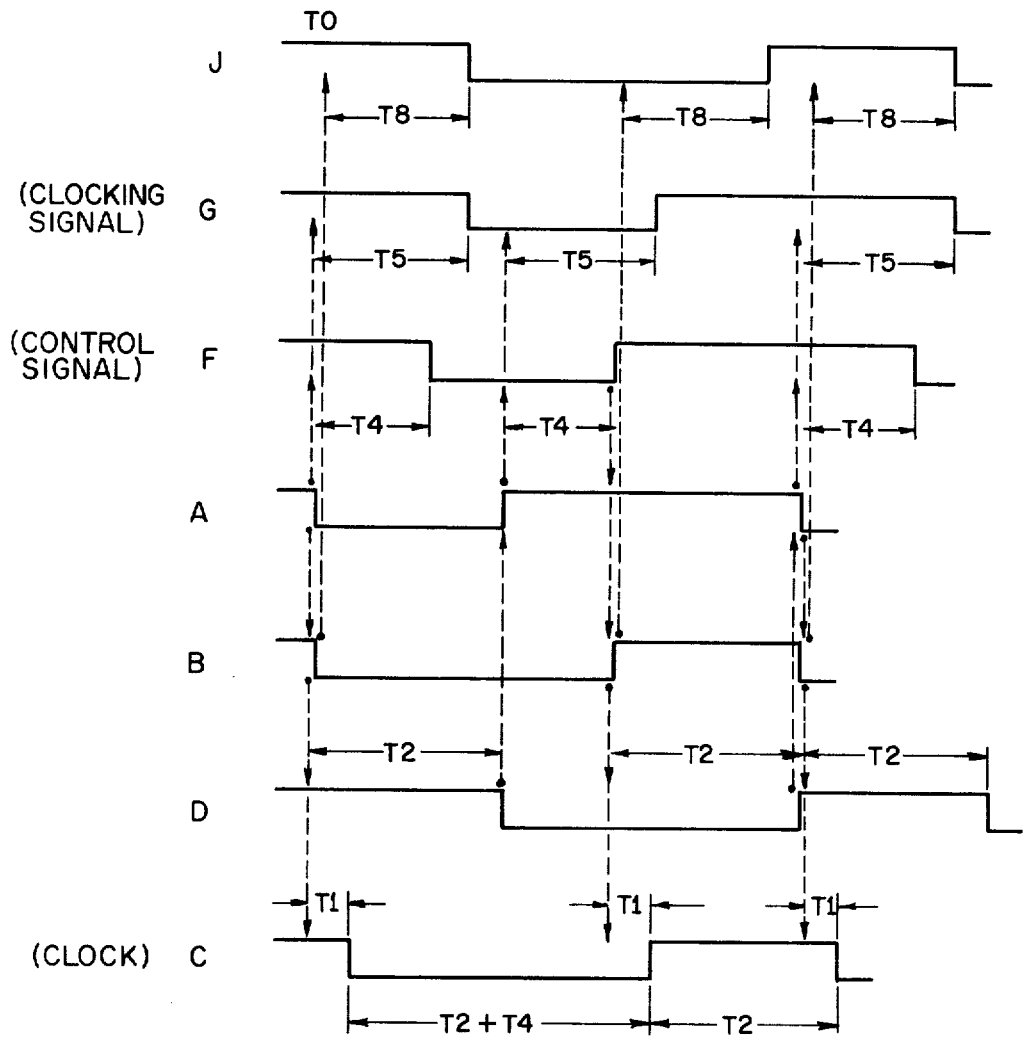

The use of a delay line and an inverting function is a well known technique by which a change in the level at the output of NAND gate 10 as depicted by wave train A of FIG. 6-1 is propagated and thereby produces through the delay line 30 wave train D of FIG. 6-1. A clock cycle of the wave train thus produced has a period equal to twice the delay of delay element 30, time T2, plus the delay of NAND gate 10 and AND gate 20.

It is noted that wave train B and all other wave trains of FIG. 6, for the purposes of simplifying discussion relating to the operation of the present invention has been shown as if there are no delays associated with gates 10, 20, 50, 60, 70, 80, 90, 100, and flip-flops 110 and 120 and INVERTER 130. It is noted, however, that the duration of each portion of the rectangular wave trains represented by wave trains A and D would be equal to the delay time of delay element 30 plus the delay produced by NAND gate 10 and AND gate 20 and that wave train A is delayed from the timing of wave train D by the delay of NAND gate 10 and further that wave train B is delayed from the timing of wave train D by the delay of NAND gate 10 plus the delay of AND gate 20.

It is well known to tap off from such delay element 30 anywhere from its input thereof to the output thereof in order to produce a clock signal. By way of example, one such tap is shown in the apparatus of FIG. 4. Such tap is shown at line 31 which results in the clock signal of wave train C having a delay of time T1 from that of wave train B.

For illustrative purposes, FIG. 4 illustrates the use of two cycle select signals or bits designated CS1 and CS2. Cycle select signals are used to select which of the possible predetermined clock cycle periods is to be generated. Although the number and encoding of the cycle select signals is not important to the present invention, for illustrative purposes, the schematic of FIG. 4 has two cycle select signals designated CS1 and CS2 originating from central processor 5. FIG. 4 illustrates the cycle select signals being provided by the decoding of the microinstructions by microprogram controller 6 within the central processor 5. A typical microprogrammed computer or controller is described in U.S. Pat. No. 4,003,033, issued Jan. 11, 1977, and need not be further described herein. The cycle select signals are set by microprogram controller 6 to yield the desired clock cycle period. A clock cycle period can either be implicitly selected by being associated with the microoperation of the microinstruction or the microinstruction can contain a clock selection field of one or more bits in which the clock cycle period is explicitly specified. Signals CS1 and CS2 are binary encoded thereby allowing the two signals to select one of, for example, four possible predetermined clock cycle periods designated basic, medium-short, medium-long, and long. FIG. 8 lists the values of signals CS1 and CS2 used to select each of the four clock cycle periods. It being understood that more or less than said number of clock cycle periods or other select signals encoding schemes may be used without departing from the scope of the present invention.

BASIC CLOCK CYCLE

Referring to FIG. 8, the basic clock cycle is selected by setting signals CS1 and CS2 high, i.e., a binary ONE. This inhibits the output of delay element 40 by forcing signals on lines 61 and 101 high and conditions the generator 1 for a basic clock cycle. The setting of signal CS1 high results in the signal on line 111 going and remaining high and the setting of signal CS2 high results in the signal on line 121 going and remaining high. The manner in which this is accomplished is discussed below. The setting of the signal on line 121 high, i.e., a binary ONE, produced a low signal, i.e., a binary ZERO, at the output of NOR gate 80, see truth table of FIG. 5-4, which in turn produces a one at the output of NAND gate 90. The signal on line 121 being high also produces a one at the output of OR gate 50, see truth table FIG. 5-3. With no stall low in progress, the stall low signal at the bottom input of AND gate 100 will be high and therefore all three inputs to AND gate 100 will be high producing a high signal on line 101 which is coupled to the top input of AND gate 20. The setting of the signal on line 111 high produces a one at the output of OR gate 60 which is line 61, coupled to the middle input to AND gate 20. With both the top and middle inputs of AND gate 20 high, the output of AND gate 20 is controlled by and equal to the bottom input of AND gate 20, see truth table FIG. 5-1. This inhibits the output from delay element 40, i.e., the signals on line 61 and 101 remain high regardless of any output from delay element 40, and conditions generator 1 for a basic clock cycle.

The completion of a stall high operation results in the stall high signal going and remaining high and with a high signal also present on line 32 the output of NAND gate 10 goes low as does the output of AND gate 20. The output of NAND gate 10 activiates delay element 40 and the output of AND gate 20 activates delay element 30. This conditions delay elements 30 and 40 to generate the basic clock cycle as described in subsequent paragraphs.

At time T1 after the output of AND gate 20 goes low, the delay element 30 tap at line 31 times out forcing wave train C low starting the low portion of the basic clock cycle. At time T2 after the output of AND gate 20 goes low, the delay element 30 tap at line 32 times out forcing wave train D low, and with the stall high signal continuing high, the occurrence of a low signal at the bottom input of NAND gate 10 forces the output from NAND gate 10 high and also the output of AND gate 20 high. At time T1 later, delay element 30 forces the tap at line 31 to time out forcing wave train C high completing the low portion of a basic clock cycle and starting the high portion of the basic clock cycle as shown in FIG. 6-1. At time T2 after the output of AND gate 20 goes high, the tap at line 32 of delay element 30 times out forcing wave train D high. With a high signal at the bottom input of NAND gate 10 and with the stall high signal remaining high at the top input of NAND gate 10, the output of NAND gate 10 goes low forcing the output of AND gate 20 low. At time T1 later, the output of delay element 30 at line 31 goes low completing the high portion of the current basic clock cycle and starting the low portion of the next clock cycle. The high portion of the basic clock cycle has a duration equal to time T2.

MEDIUM-SHORT CLOCK CYCLE

Again referring to FIG. 8, it can be seen that the medium-short clock cycle is selected by setting cycle select signal CS1 low and CS2 high. The setting of signal CS1 low results in the output on line 111 going and remaining low and the setting of signal CS2 high results in the output on line 121 going and remaining high as will be seen below. As seen above in the discussion of the basic clock cycle, the setting of the signal on line 121 high in conjunction with the stall low signal being high will result in the output of AND gate 100 always remaining high independent of the signal levels on lines 44, 45, 46 and 47, which are taps on delay element 40. With signal on line 111 low, the output of OR gate 60 will be controlled by and equal to the level of the signal provided by delay element 40 on line 43. It can be seen from FIG. 4 that the output of AND gate 20 is controlled by the output of delay element 40 on line 43 and the output of NAND gate 10. This setting of CS1 low and CS2 high enables the control signal from delay element 40 on line 43 to expand the duration of the low portion of the clock cycle from time T2 to time T2 plus T3 and to produce a medium-short clock cycle with a high portion duration of time T2 and a low portion with a duration of time T2 plus T3 as will be seen below.

The initial activity during the low portion of a medium-short clock cycle is essentially the same as in the basic clock cycle described above. Completion of a stall high operation drives the output of NAND gate 10 and AND gate 20 low. Note that at this time the output of AND gate 20 will go low regardless of the signal level on lines 43 and 61 because the bottom input of AND gate 20 is coupled to the output of NAND gate 10. The output of NAND gate 10 activates delay element 40 and the output of AND gate 20 activates delay element 30. This conditions delay elements 30 and 40 to generate the medium-short clock cycle as described in subsequent paragraphs.

At time T1, after the output of NAND gate 10 and AND gate 20 go low, delay element 30 tap at line 31 times out forcing wave train C low, thereby starting the low portion of the medium-short clock cycle. At time T3 after the output of NAND gate 10 goes low, delay element 40 tap at line 43 times out forcing wave form E low along with the output of OR gate 60 on line 61. FIG. 4 illustrates that under these conditions, i.e., signal CS1 low, the output of OR gate 60 will continue low until time T3 after a high signal appears at the output of NAND gate 10. At time T2 after the output of NAND gate 10 and AND gate 20 go low, delay element 30 tap at line 32 times out forcing wave form D low. With the stall high signal continuing high, the occurrence of a low signal at the bottom input of NAND gate 10 forces the output of NAND gate 10 high.

As stated above, the control signal provided by extruder logic 3 must be in the low state before the clock train would otherwise go to the high state. In the case of the medium-short clock cycle, because the control signal is derived solely from delay element 40 at line 43, this translates into the requirement that time T3 must be shorter than time T2. If this condition is not met, the output of NAND gate 10 will go high before the top input to AND gate 20 goes low and therefore the low portion of the clock cycle would not be extended by the control signal in the desired manner. FIG. 6-2 illustrates the medium-short clock cycle with time T3 chosen to be two-fifths of time T2, i.e., the requirement that T3 be less than T2 is met and the desired result is achieved in wave train C of FIG. 6-2. FIG. 6-3 illustrates the medium-short clock cycle with time T3 chosen to be seven-fifths of time T2, i.e, the requirement that time T3 be less than time T2 is not met and results in wave train C of FIG. 6-3 not being the desired wave train.

Putting aside the simplifying assumption that there is no delay associated with the gates of the present invention, the requirement that the control signal be in the low state before the clock train would otherwise go to the high state for the medium-short clock cycle translates into the requirement that time T3 plus the time of the associated delay of OR gate 60 must be less than time T2 plus the time of the associated delays of AND gate 20 and NAND gate 10. The remainder of this and other clock cycles will be discussed as if there is no delay associated with the gates of the present invention.

The occurrence of the high signal at the output of NAND gate 10 will not immediately change the output of AND gate 20 which will continue low until the high signal from the output of NAND gate 10 propagates through delay element 40 appearing on line 61 at time T3 after first occurring at the bottom input of AND gate 20. At time T3 later, all three inputs to AND gate 20 will be high and the output of AND gate 20 will go from the low to the high state. It will be noted that the output of delay element 30 on line 32 remains low, and therefore the output of NAND gate 10 remains high, until time T2 after the output of AND gate 20 goes from low to high. Note further that with the signal CS1 low and the signal CS2 high, that until the output of delay element 40 on line 43 goes high, the output of AND gate 20 remains low.

With the occurrence of a high signal at the middle input of AND gate 20, at time T3 after the high signal first occurred at the output of NAND gate 10, which is coupled to the bottom input of AND gate 20, the output of AND gate 20 goes high. At time T1 after the output of AND gate 20 goes high, delay element 30 tap at line 31 times out forcing wave train C high, starting the high portion of the medium-short clock cycle and completing the low portion with a time of T2 plus T3. The high signal propagates through delay element 30 and appears at line 32 at time T2 after first appearing at the output of AND gate 20. This high signal at the bottom input of NAND gate 10 forces the output of NAND gate 10 low, which in turn forces the output of AND gate 20 low. This low signal propagates through delay element 30 and forces wave train C low at time T1 later, thereby completing the high portion with a time T2.

The completion of the high portion of the clock cycle completes the medium-short clock cycle and conditions the apparatus for the next clock cycle.

MEDIUM-LONG CLOCK CYCLE

Again referring to FIG. 8, it can be seen that the medium-long clock cycle is selected by setting cycle select signal CS1 high and signal CS2 low. The setting of CS1 high results in the signal on line 111 going and remaining high and the setting of CS2 low results in the signal on line 121 going and remaining low. The manner in which this is accomplished is discussed below. As seen above in the basic clock cycle, the setting of the signal on line 111 high results in the output of OR gate 60 and therefore the middle input of AND gate 20 remaining high regardless of the signal level on line 43 of delay element 40. Further, the setting of the signal on line 111 high results in the output of NOR gate 80 going low which results in the output of NAND gate 90 going high and remaining high regardless of the signal level on lines 46 and 47 from delay element 40. The output of NAND gate 90 remaining high, in conjunction with the stall low signal remaining high, will result in the output of AND gate 100 being equal to and controlled by the middle input of AND gate 100 which is coupled to the output of OR gate 50 on line 51.

Since the top input to OR gate 50 is line 121 which is low, the output of OR gate 50 is equal to and controlled by the bottom input which is line 44 of delay element 40. This results in the top input of AND gate 20 being controlled by and equal to the output of delay element 40 at line 44, the middle input of AND gate 20 being high and the bottom input of AND gate 20 being controlled by and equal to the output of NAND gate 10.

With these conditions established, the operation of the medium-long clock cycle is analogous to the medium-short clock cycle with the difference being that in the medium-long clock cycle the top input of AND gate 20 is controlled by the output of delay element 40 at line 44 and the middle input of AND gate 20 is always high. Whereas in the medium-short clock cycle, the top input of AND gate 20 is always high and the middle input of AND gate 20 is controlled by the input of delay element 40 at line 43. As was seen above in the medium-short clock cycle, AND gate 20 is used to control the expansion of the low portion of the clock cycle by inhibiting the input of delay element 30 from going high until the high signal has propagated through delay element 40 and into an input of AND gate 20. In the medium-short clock cycle, this propagation requires time T3 and the high signal is fed into the middle input of AND gate 20 via OR gate 60. In the case of the medium-long clock cycle, the propagation requires time T4 and the high signal is fed into the top input of AND gate 20 via OR gate 50 and AND gate 100.

As stated above, the control signal must be in the low state before the clock train would otherwise go to the high state. In the medium-short clock cycle above, where the control signal was derived solely from one tap at line 43 on delay element 40, it was shown that the requirement was satisfied by requiring that time T3 be less than time T2. In the medium-long clock cycle, where the control signal is derived solely from one tap at line 44 on delay element 40, this requirement is satisfied by requiring that time T4 is less than time T2.

As in the case of the medium-short clock cycle, the duration of the high portion of the clock cycle is controlled by delay element 30, is of duration time T2, and is not affected by any of the outputs from delay element 40. The completion of the high portion completes the medium-long clock cycle and conditions the apparatus for the next clock cycle. As seen above, the selection of the medium-long clock cycle, by setting signal CS1 high and signal CS2 low, enables the control signal to expand the duration of the low portion of the clock cycle from time T2 to time T2 plus time T4 and to produce a medium-long clock cycle with a high portion of duration time T2 and a low portion of duration time T2 plug T4.

LONG CLOCK CYCLE

In the previous clock cycles, the requirement that the control signal, during each clock cycle, must be in the low state before the clock train would otherwise go to the high state, has been met by requiring that the delay time provided by delay element 40 to the single signal used in forming the control signal be less than the delay time, time T2, of delay element 30 of generator 1. By using an appropriate series of delayed rectangular wave train signals from delay element 40, it is possible to have the longest delayed time of delay element 40 exceed the delay time T2 provided by delay element 30. By way of illustration, in the preferred embodiment, the control signal of the long clock cycle is formed by logically ANDing together the signals on lines 43, 44, 46 and 47. With times T3 less than T4, T4 less than T6, and T6 less than T7, by introducing the constraint that the difference in time between time T6 and time T4 and between time T7 and T6 is less than time T2, and retaining the constraints that time T3 and time T4 are less than time T2, the preferred embodiment will generate a control signal that goes to the low state at time T3 and remains low until time T7.

The requirement that, once a control signal goes to the low state, the control signal must remain in the low state until the termination of the desired extension period, can be seen by way of example in the case of the medium-short clock cycle. In the medium-short clock cycle, the extension of the low part of the clock cycle is controlled by the middle input of AND gate 20 because the top input of AND gate 20 is always high and the bottom input of AND gate 20 goes high in advance of the middle input. Therefore, the output of AND gate 20 goes high and thereafter the clock train goes high when the middle input of AND gate 20 goes high.

Again referring to FIG. 8, it can be seen that the long clock cycle is selected by setting cycle select signals CS1 and CS2 low. The setting of CS1 low results in the output of line 111 going and remaining low and the setting of CS2 low results in the output of line 121 going and remaining low as will be seen below. The setting of the signal on line 111 low, which is the top input of OR gate 60, results in the output of OR gate 60 being controlled by and equal to the bottom input of OR gate 60 which is an output of delay element 40 on line 43. This results in the middle input of AND gate 20 being controlled by and equal to the output of delay element 40 on line 43. The setting of the signal on line 121 low, which is the top input of OR gate 50, results in the output of OR gate 50 being controlled by and equal to the bottom input of OR gate 50 which is an output of delay element 40 on line 44. Therefore, the middle input of AND gate 100 is controlled by and equal to the output of delay element 40 on line 44.

With the signals on line 111 and line 121 being low, the output of NOR gate 80 on line 81 will be high, which being coupled to the bottom input of NAND gate 90, results in the output of NAND gate 90 on line 91 being controlled by and the inverse of the signal at the top input of NAND gate 90. That is, in the case of the long clock cycle, NAND gate 90 is acting as an inverter of the output of NAND gate 70 on line 71. It is well known that the logical equivalents of a NAND gate followed by an INVERTER is an AND gate, considered with reference to the inputs of the NAND gate and the output of the INVERTER. Therefore, in order to simplify the discussion of the long clock cycle, the top input of AND gate 100 will be discussed as the logical AND of the signals provided by delay element 40 on lines 46 and 47.

With the stall low signal continuing high, the bottom input of AND gate 100 plays no part in determining the output of AND gate 100. The output of AND gate 100, which is coupled to the top input of AND gate 20, is controlled by and equal to the logical AND of the top input of AND gate 100, which is the logical AND of the signals on lines 46 and 47, and the middle input of AND gate 100, which is the signal on line 44.

It is well known that the logical equivalents of a series of AND gates coupled so that the outputs of earlier AND gates are inputs to subsequent AND gates is an AND gate having the inputs not coupled to an earlier AND gate in the series and the output of last AND gate. With the above conditions established, it follows that in the case of the long clock cycle, the control signal is the logical AND of the delayed rectangular wave train signals appearing on lines 43, 44, 46 and 47. This control signal meets the requirement that during each clock cycle, the control signal must be in the low state before the clock train would otherwise go to the high state, and the control signal must remain in the low state until termination of the desired extension period.

The operation of the long clock cycle is analogous to the operation of the medium-short and medium-long clock cycles discussed above. The control signal from extender logic 3 goes to the low state at time T3 and to the high state at time T7 after the signal on line 11 goes from the high to low state. This control signal results in the low portion of the clock cycle being extended from a duration of time T2 to a duration of time T2 plus T7 and the production of a long clock cycle with a low portion of duration time T2 plus T7 and a high portion of duration time T2.

CYCLE SELECT SYNCHRONIZATION

The preferred embodiment in FIG. 4 illustrates the apparatus of the present invention including the select synchronizer element 4. The removal of the components of the select synchronizer element 4 and the application of the cycle select signal CS1 directly on line 111 and the cycle select signal CS2 directly on line 121 results in the operation as described above in the basic, medium-short, medium-long, and long clock cycles. In this mode of operation, where the clock cycle period is not selected dynamically, the cycle selection occurs before the stall high signal goes to the high state and the clock system generates a continuous clock train with the period of each clock cycle being that of the selected predetermined clock period.

As described above, to allow the clock cycle period to be dynamically selected, the cycle select signals must become stable and be gated to extender logic 3, during each clock cycle, before the clock train would otherwise go to the high state. In the apparatus illustrated in FIG. 4, this requirement is met by tapping delay element 40 at line 45 such that time T5 is less than T2 and feeding the delayed rectangular wave train through an inverter, 30 and into the clock inputs of flip-flops 110 and 120 and the cycle select signals into the data inputs of flip-flops 110 and 120. FIG. 6-1 illustrates that time T2 provided by delay element 30 determines the duration of the low portion, which determines when the clock train would otherwise to to the high state, of the basic clock cycle which has a low portion of the shortest duration. Therefore, the cycle select signals must become stable and be gated to extender logic 3 within time T2 of the start of a low portion of the clock cycle.

Figures 5, 6:
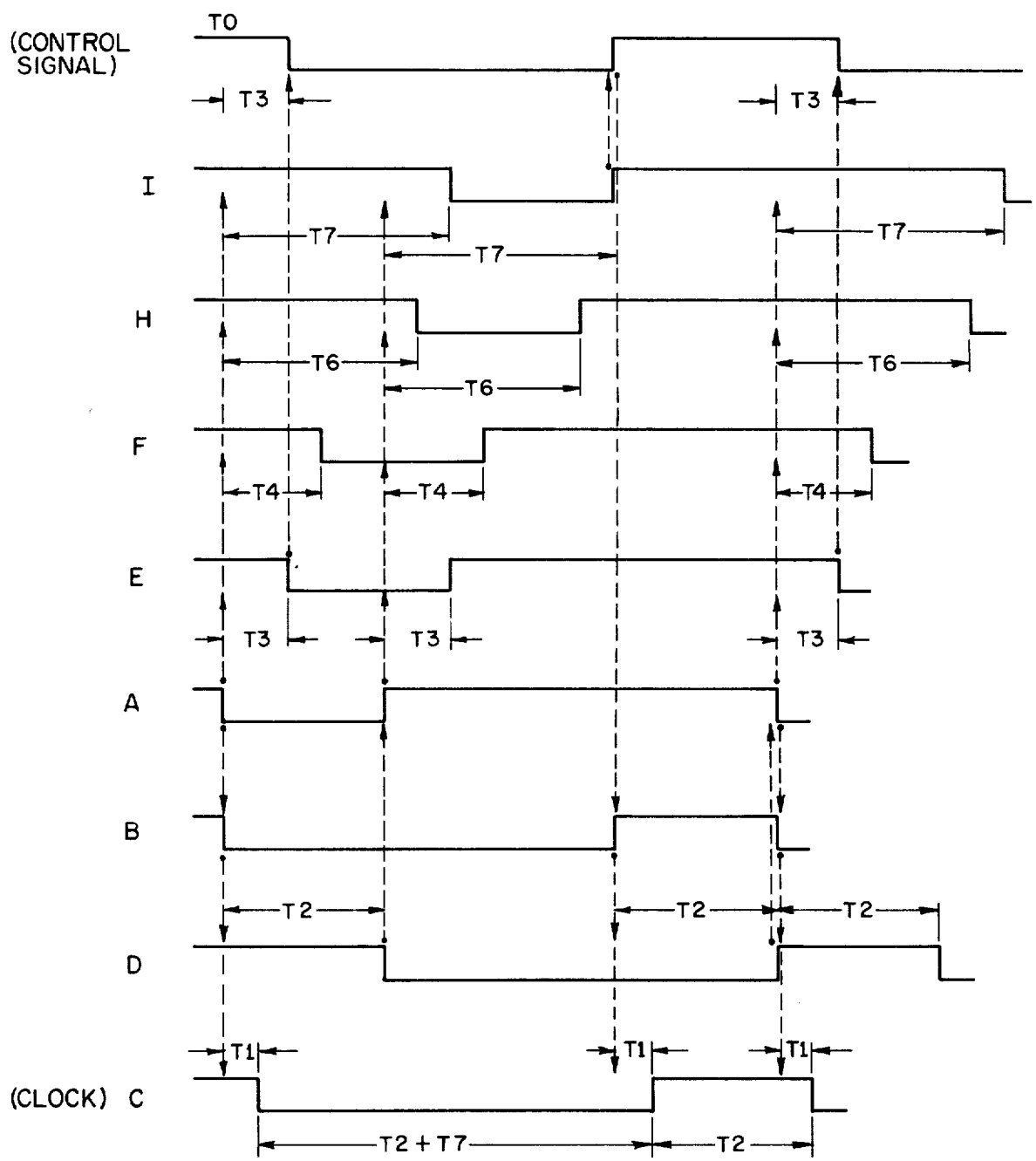

Select synchronizer element 4 operates in the following manner to permit the dynamic selection of the clock cycle period. FIG. 5-6 illustrates that flip-flops gate and hold the input signal of the flip-flop to the output of the flip-flop when the clocking signal goes from the low to the high state. The delayed rectangular wave train signal on line 45 goes from the high to the low state at time T5 after the signal on line 11 goes from the high to the low state. Therefore, the output of INVERTER 130 on line 131 goes from the low to the high state at time T5 after the signal on line 11 goes from the high to low state. This clocking signal on line 131 is therefore used to clock the cycle select signals CS1 and CS2 into flip-flops 110 and 120 respectively. It should be noted that cycle select signals CS1 and CS2 must become stable on the inputs to flip-flops 110 and 120 before the occurrence of the clocking signal at time T5 after the start of the low portion of the clock cycle. As long as this condition is met, the cycle select signal will be gated onto lines 111 and 121 at time T5 after the start of the low portion of a clock cycle.

As seen above, in the earlier discussion of the clock cycles, the control signal of extender logic 3 appears on lines 61 and 101 which are coupled to the middle and top inputs to AND gate 20. During the initial portion of the low portion of a clock cycle, the signal on the bottom input of AND gate 20 on line 11 is low and the output of AND gate 20 on line 21 is therefore low. FIG. 5-1 illustrates that the occurrence of a single low signal at any input of an AND gate results in the output of the AND gate being a low signal. Therefore, during this initial portion of a low portion of the clock cycle, the state of the top two inputs of AND gate 20 will not affect the output of AND gate 20 which is low. Therefore, as long as the control signal on the top and middle inputs of AND gate 20 become stable before the bottom input of AND gate 20 goes high, the apparatus will operate in the desired manner and permit the dynamic selection of the clock cycle periods. The signal on line 11 will go high at time T2 after initially going from the high to low state, the control signal at the top and middle inputs of AND gate 20 will become stable at time T5 after the signal on line 11 goes from the high to low state, and since time T5 is less than time T2 the above condition is met. Therefore, the addition of select synchronizer element 4 permits the clock cycle period to be dynamically selected after the clock cycle has started.

The preferred embodiment in FIG. 4 illustrates that the clocking signal of flip-flops 110 and 120 is derived by inverting the signal on line 45 which is a tap on delay element 40. Alternatively, a clocking signal can be derived by coupling line 38, a tap on delay element 30, to the input of INVERTER 130 in place of line 45 as shown in FIG. 4. For this substitution of line 38 for line 45 at the input of INVERTER 130 to operate properly, time T8 must be less than time T2 in an analogous manner to meet the requirement that when line 45 is used that time T5 must be less than time T2. The validity of this substitution follows from the fact that the signal on the input of the flip-flop is gated to the output of the flip-flop when the clocking signal goes from the low to high state. When line 45 is used, this low to high state change on line 131 occurs when the signal on line 45 goes from the high to low state. When line 38 is used, this low to high state change on line 131 occurs when the signal on line 38 goes from the high to low state which occurs at time T8 after the signal on line 11 goes from the high to the low state.

FIG. 6-4 demonstrates that in all cases wave train G, the signal occurring on line 45, is the same as wave train A, the signal occurring on line 11, delayed by time T5. Wave train J, the signal appearing on line 38, is that of wave train B, the signal appearing on line 21, delayed by time T8. FIG. 6-4 further illustrates that in each instance that the signal of wave train A goes from the high to the low state, the signal of wave train B simultaneously goes from the high to the low state. Therefore, since it is this high to low state change in the signal level that is delayed and used as input to INVERTER 130 to form the flip-flop clocking signal, it follows that the delayed rectangular waveform used as the input for INVERTER 130 can be obtained from either delay element 40 or delay element 30.

STALL CONDITIONS

Figures 1, 7:
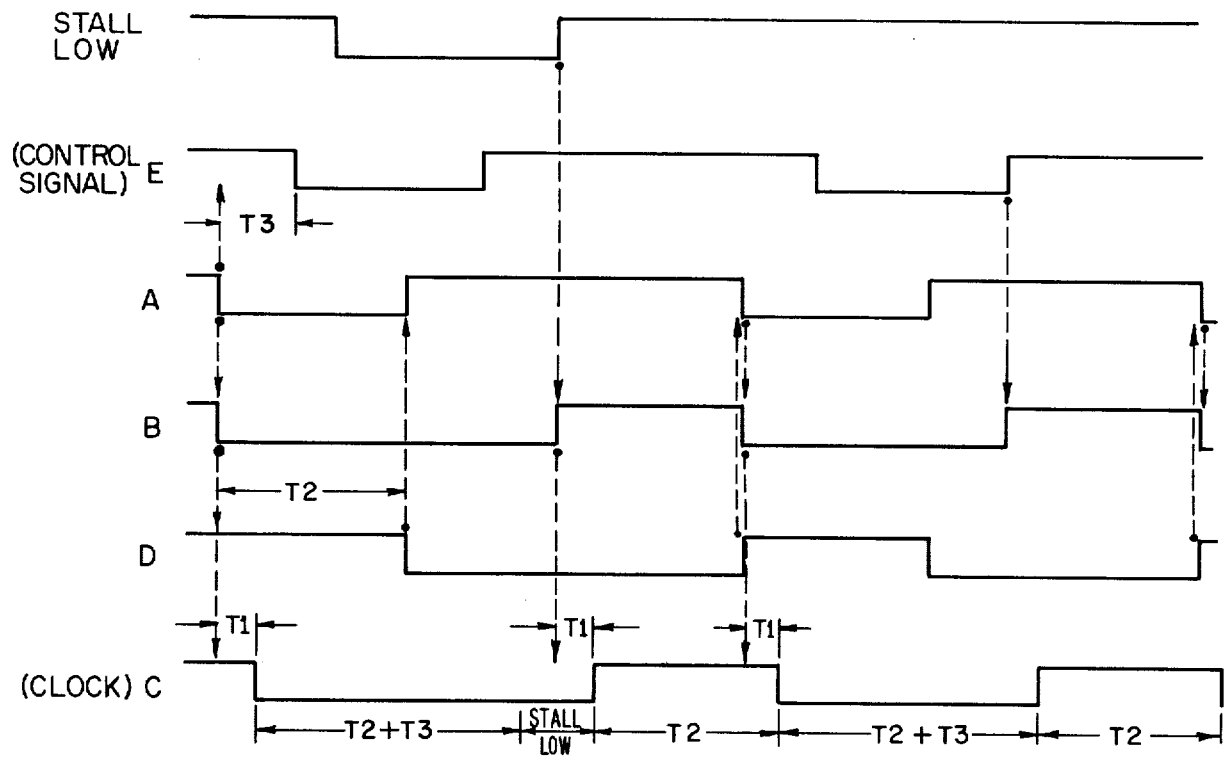
Figures 2, 7:
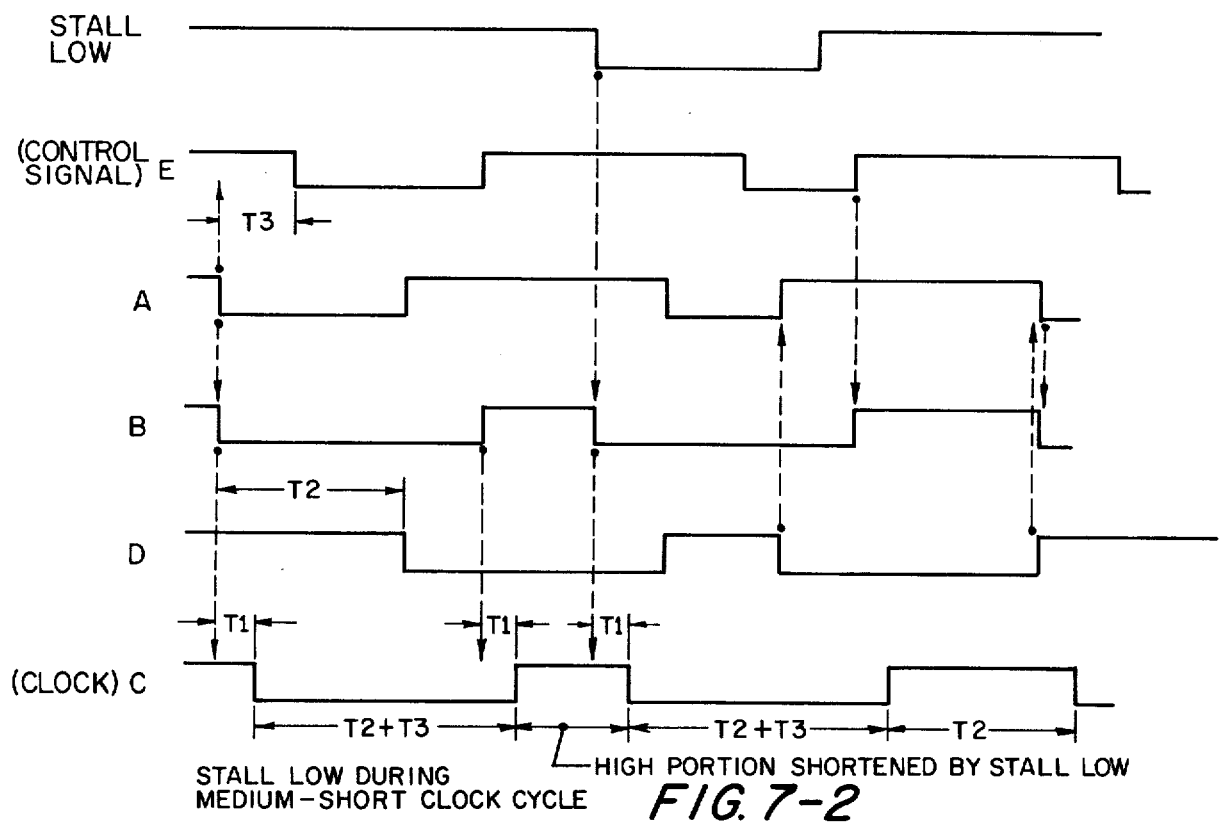

FIG. 7-1 illustrates the wave trains resulting from a stall low condition occurring when the control signal, wave train E, is in the low state and continuing until after the control signal goes to the high state. The stall low condition is indicated by the signal on the stall low line going from the high state to the low state. The stall low condition continues until the signal on the stall low line goes from the low state to the high state. Referring to FIG. 7-1, it can be seen that the low portion of the clock train, wave train C, is extended by the time that the stall low signal is in the low state past that point in time that the control signal, wave train E, goes from the low to high state. That is, in FIG. 7-1, the low portion of the first clock cycle has been extended by a time equal to the amount of time that the stall low signal is in the stall condition, i.e., in the low state, after the control signal has gone high.

Again referring to FIG. 7-1, it can be seen that the clock train recovers from the removal of the stall low condition in a minimal amount of time. In the preferred embodiment, the recovery time of the clock train is equal to time T1 which is primarily a function of where the clock train signal is tapped from delay element 30. It should also be noted that once the clock system recovers, it continues its normal operation until the occurrence of a subsequent stall condition.

FIG. 7-2 illustrates a second case of the stall low condition. In FIG. 7-2, the stall low condition initially occurs when the control signal, waveform E, is in the high state and the stall low condition terminates when the control signal is in the low state. Referring to FIG. 7-2, it can be seen that with these conditions established, the stall low condition will shorten the high portion of the clock cycle. It can also be seen that, the removal of the stall condition while the control signal is in the low state results in the low portion of the clock cycle having a normal duration.

By combining the results shown in FIGS. 7-1 and 7-2, it can be seen that if a stall low condition is initiated while the control signal is in the low state and removed while the control signal is still in the low state that the clock train, wave train C, is not affected by the occurrence of the stall low condition. This can be further seen by referring to FIG. 4. As seen above in the case of the medium-short clock cycle, the control signal is wave train E occurring on line 43 which is connected via OR gate 60 to the middle input of AND gate 20. If the control signal is in the low state, the output of AND gate 20 will be low. If a stall condition occurs while wave train E is low, the output of AND gate 20 will not change and will continue low. If the stall condition is removed by the stall low signal going from the low state to the high state, the output of AND gate 100 which is coupled to the top input of AND gate 20 will change from the low state to the high state and the output of AND gate 20 will then again be exclusively controlled by the signal on line 43, wave train E, and the output of NAND gate 10. From these conditions, it can be seen that the appearance and subsequent disappearance of the stall low condition while wave train E is in the low state will not affect the output of AND gate 20 and therefore the clock train will not be affected by the appearance and disappearance of the stall low condition under these circumstances.

The response of the clock system to a stall high condition is analogous to the response to the stall low condition. If the stall high signal goes low while wave train D is low and remains low after wave train D goes high, wave train A remains high until the stall high signal goes high, i.e., the clock train is stalled in the high state.

If the stall high signal goes low while wave train D is low and returns high while wave train D is still low, the appearance and disappearance of the stall high condition will not be seen in the clock wave train. The effect on the clock wave train of the stall high signal going low while wave train D is high is a function of the clock cycle period selected and the length of time which the stall high signal remains low. Under these conditions, if the stall high signal remains low longer than the delay period selected by the cycle select signals, the clock train will go from the low to high state. The clock wave train will remain high in response to the stall high signal being low for a period of time equal to the time that the stall high signal is low in excess of the selected delay period provided by extender logic 3.

As seen above, the shortest cycle period is the basic cycle. The discussion above further shows the only active elements in the circuit path of the basic clock cycle are NAND gate 10, AND gate 20, and delay element 30. The remainder of the elements in FIG. 4 contribute only to setting the top and middle inputs of AND gate 20 high before the completion of the low portion of the cycle, i.e., within time T2 of the start of the low portion, and do not play an active roll in determining the timing of the basic clock cycle. Therefore, the clock system has a minimum number of components in the circuit path used to generate the shortest cycle period.

In all of the above discussion of the various clock cycles, the clock train has been discussed as being the signal occurring at the tap of delay element 30 at lines 31. Because no constraints have been placed upon time T1, the clock train can in fact be derived from a signal taken directly from the output of AND gate 20 or any tap of delay element 30. There is no restriction that time T1 be less than or equal to or greater than time T2. As seen above, time T1 simply determines the speed of recovery of the clock system from the removal of either the stall high or stall low conditions.

It is understood that the circuit illustrated in FIG. 4 can be composed of other logic elements, in particular, the use of other logic elements having more inputs would reduce the number of elements and that a single delay element may be replaced by a plurality of delay elements connected serially, and that such alternatives could have been used without departing from the scope of the present invention.

What is claimed is:

1. A clock system comprising:
   (a) first means having a first control input, a first control output, and a clock output, for generating at said clock output a clock cycle, said clock cycle having a first portion having a first state and a second portion having a second state, said first portion having a duration substantially equal to a first time period and said second portion having a duration substantially equal to a second time period;
   (b) second means, included in said first means for generating a first output signal at said first control output of said first means, said first output signal having a first state and a second state;
   (c) third means coupled to said first means for delaying said first output signal by a plurality of predetermined time periods to generate a plurality of delayed output signals, each of said delayed output signals having a first state, a second state, and an associated predetermined time delay period whereby a change in state of said first output signal appears in each of said more delayed first output signals after substantially said associated predetermined delay time period;
   (d) logic means coupled with said first means and said third means and including gating means and means coupled thereto for generating a first selection signal to enable said gating means to select one of said delayed first output signals, said logic means further including means responsive to said first selection signal and said selected one of said delayed first output signals for generating a first control signal, said gating means operating such that said first control signal transitions to its first state before said first output signal transitions to its second state and said first control signal remains in said first state until after said first output signal transitions to its second state for substantially the associated predetermined delay time period of said selected delayed first output signal;
   (e) means included in said first means for generating said clock cycle such that said first time period is substantially equal to said second time period plus the associated predetermined delay time period of said selected delayed first output signal; and
   (f) fourth means included in said first means for receiving said first control signal at said first control input of said first means, said first control signal having a first state and a second state, said first state operative to disable said first means from generating said second portion of said clock cycle and said second state operative to enable said first means to generate said second portion of said clock cycle, whereby a change in said first control signal from said first state to said second state enables the generation of said second portion of said clock cycle.

2. A system as in claim 1 further comprising sixth means, coupled to said logic means, for supplying thereto a second selection signal and a synchronization signal for controlling the generation of said first selection signal, said synchronization signal having a first state and a second state, said second selection signal being received before said synchronization signal transitions from its said second state to said first state, during each of said clock cycles, said synchronization signal transitioning from said first state to said second state after said first output signal transitions from said first state to said second state but before said first output signal transitions from said second state to said first state, whereby said first selection signal is generated such that duration of said first portion of said clock cycle can be dynamically selected during said first portion of said clock cycle.

3. A clock system comprising:
   (a) first means, having a first output, a first input, and a clock output, for generating a first signal having a first state and a second state at said first output, said first means for receiving a second signal having a third state and a fourth state at said first input, said first means for generating a clock signal having a fifth state and a sixth state at said clock output, said clock signal producing a series of clock cycles, each of said clock cycles having a first portion, having said fifth state for a duration substantially equal to a first time period and having a second portion having said sixth state for a duration substantially equal to a second time period;

(b) second means having a second input and a second output, said second input coupled to said first output of said first means, said second means for generating at said second output one or more delayed first signals in response to said first signal received at said second input, each of said one or more delayed first signals having said first state and said second state, each of said one or more delayed first signals having an associated predetermined delay time period;

(c) third means having a third input, a third output, and a fourth input, said third input coupled to said second output of said second means, said third output coupled to said first input of said first means, and fourth input for receiving a first selection signal, said first selection signal when in a predetermined state being operative to select one of said one or more delayed first signals, said third means including means for generating said second signal at said third output in response to said selected one of said one or more delayed first signals such that said second signal transitions to said third state before said first signal transitions from said first state to said second state, said third means including further means for enabling said second signal to remain in said third state after said first signal transitions to said second state for a time period substantially equal to the associated predetermined delay period of said selected one of said one or more delayed first signals; and (d) fourth means, included in said first means, for receiving said second signal at said first input, said fourth means operative to enable said first means to generate said second portion in response to said fourth state and to disable said first means to generate said second portion in response to said third state, whereby a change in said second signal from said third state to said fourth state enables for generation of said second portion of said clock cycles.

4. A system as in claim 3 wherein said first means further includes a means for generating a clock cycle having a first portion of a duration substantially equal to said first time period plus the associated predetermined delay time period of said selected one of said delayed first signals and a second portion of a duration substantially equal to said second time period.

5. A system as in claim 4 further comprising fifth means having a fifth input, a fifth output, and a sixth input, said fifth output coupled to said fourth input, said sixth input for receiving a synchronization signal having a fifth state and a sixth state, said fifth means for generating said first selection signal at said fifth output in response to a second selection signal received at said fifth output and in response to said synchronization signal.

6. A system as in claim 5 wherein said fifth means further includes a means for generating said first select signal during each of said clock cycles before said first signal transitions from said first state to said second state in response to receiving said second selection signal at said fifth input before said synchronization signal transitions from said sixth state to said fifth state, whereby said duration of said first portion can be dynamically selected during each clock cycle independently of said duration of said first portion of a preceding or succeeding one of said clock cycles.

7. A system as in claim 6 wherein said second means further includes a means for generating said synchronization signal at a seventh output, said seventh output of said second means coupled to said sixth input, said synchronization signal, during each of said clock cycles, transitioning from said sixth state to said fifth state after said first signal transitions from said second state to said first state, but before said first signal transitions from said first state to said second state.

8. A system as in claim 7 wherein said third means further includes a means for recovering a stall low signal at a ninth input of said third means, said stall low signal having a seventh state and an eighth state, such seventh state operative to inhibit said third means from generating said fourth state of said second signal and said eighth state operating to enable said third means to generate said fourth state of said second signal.

9. A system as in claim 8 wherein said first means further includes a means for receiving a stall high signal at a tenth input of said first means, said stall high signal having a ninth state and a tenth state, said ninth state operative to inhibit said first means from generating said first state of said first signal, said tenth state operative to enable said first means to generate said first state of said first signal.

10. A system as in claim 6 wherein said first means further includes a means for generating said synchronization signal at an eighth output of said first means, said eighth output coupled to said sixth input, said synchronization signal, during each of said clock cycles, transitioning from said sixth state to said fifth state after said first signal transitions from said second state to said first state, but before said first signal transitions from said first state to said second state.

11. A system as in claim 10 wherein said third means further includes a means for receiving a stall low signal at a ninth input of said third means, said stall low signal having a seventh state and an eighth state, such seventh state operative to inhibit said third means from generating said fourth state of said second signal and said eighth state operating to enable said third means to generate said fourth state of said second signal.

12. A system as in claim 11 wherein said first means further includes a means for receiving a stall high signal at a tenth input of said first means, said stall high signal having a ninth state and a tenth state, said ninth state operative to inhibit said first means from generating said first state of said first signal, said tenth state operative to enable said first means to generate said first state of said first signal.

13. A system as in claim 3 wherein said second means is a delay line.

14. A system as in claim 3 wherein said third means comprises logic gates for logically ANDing together said one or more of said delayed first signals.

15. A system as in claim 14 wherein said fifth means comprises one or more flip-flops having data inputs, a clock input and a data output, each of said data inputs for receiving one of a series of signals comprising said second selection signal, each of said data outputs for transmitting one of series of signals comprising said first selection signal, each of said one or more flip-flops for gating and holding at signal at said data input onto said data output in response to a change in state of said synchronization signal at said clock input.

16. A system as in claim 15 wherein said first means is a square wave generator comprising an inverting element and a delay line.

17. A method for generating a clock cycle having a time period of selectable predetermined duration which comprises:

(a) generating a rectangular wave train through use of a generator having a first output, a first input, and a clock output, said first output for transmitting a first signal having a first state and a second state, said first input for receiving a second signal having a third state and a fourth state, said clock output for transmitting a clock signal having a fifth state and a sixth state, said clock signal producing a series of clock cycles each having a first portion and a second portion, said first portion being in said fifth state for a duration substantially equal to a first time period and said second portion being in said second state for a duration substantially equal to a second time period;

(b) delaying said first signal by one or more predetermined delay time periods to produce one or more delayed said first signals;

(c) synchronizing the generation of said delayed first signals during each one of said clock cycles such that each said delayed first signal transitions to a delayed first state, corresponding to said first state of said first signal, at a time when said first signal exists in said first state; and (d) feeding a selected one of said delayed first signals to said first input to supply said second signal such that the delayed first and second states of said selected delayed first signal correspond to the fourth and third states, respectively, of said second signal, said third state being operative to disable said generator from generating said second portion and said fourth state being operative to enable said generator to generate said second portion.

* * * * *